United States Patent
Lin et al.

(10) Patent No.: US 9,793,127 B2
(45) Date of Patent: Oct. 17, 2017

(54) PLASMA GENERATION AND PULSED PLASMA ETCHING

(71) Applicant: Taiwan Semiconductor Manufacturing Company Limited, Hsin-Chu (TW)

(72) Inventors: Yu Chao Lin, Hsinchu (TW); Chao-Cheng Chen, Shin-Chu (TW)

(73) Assignee: Taiwan Semiconductor Manufacturing Company Limited (TW)

( * ) Notice: Subject to any disclaimer, the term of this patent is extended or adjusted under 35 U.S.C. 154(b) by 0 days.

(21) Appl. No.: 14/078,787

(22) Filed: Nov. 13, 2013

(65) Prior Publication Data

US 2015/0132971 A1    May 14, 2015

(51) Int. Cl.
| | | |
|---|---|---|
| *H01L 21/3065* | (2006.01) | |
| *H01L 21/033* | (2006.01) | |
| *G03F 7/40* | (2006.01) | |
| *G03F 7/42* | (2006.01) | |
| *H01L 21/027* | (2006.01) | |
| *H01L 21/311* | (2006.01) | |

(52) U.S. Cl.
CPC ............ *H01L 21/3065* (2013.01); *G03F 7/40* (2013.01); *G03F 7/427* (2013.01); *H01L 21/0273* (2013.01); *H01L 21/0337* (2013.01); *H01L 21/31138* (2013.01)

(58) Field of Classification Search
CPC ............. H01L 21/0273; H01L 21/3065; H01L 21/0337; G03F 7/40; G03F 7/427
See application file for complete search history.

(56) References Cited

U.S. PATENT DOCUMENTS

| | | | | |
|---|---|---|---|---|
| 5,968,374 | A * | 10/1999 | Bullock | H01J 37/32082 216/16 |
| 6,410,451 | B2 * | 6/2002 | Nguyen | 257/E21.252 |
| 7,955,516 | B2 * | 6/2011 | Chandrachood et al. | 216/67 |
| 7,988,874 | B2 * | 8/2011 | Lee et al. | 216/67 |
| 8,329,585 | B2 * | 12/2012 | Sheu | H01J 37/32091 216/41 |
| 8,383,001 | B2 * | 2/2013 | Mochiki | H01J 37/32027 156/345.1 |
| 2004/0038541 | A1 * | 2/2004 | Baier | H01L 21/32136 438/703 |
| 2005/0239290 | A1 * | 10/2005 | Hsu | 438/710 |
| 2006/0154184 | A1 * | 7/2006 | Mahorowala et al. | 430/323 |
| 2008/0081483 | A1 * | 4/2008 | Wu | 438/714 |

OTHER PUBLICATIONS

H. Xiao, Introduction to Semiconductor Manufacturing Technology, SPIE Press, year 2012, ISBN 978-0-8194-9092-6, chapter 7.*

* cited by examiner

*Primary Examiner* — Jiong-Ping Lu
(74) *Attorney, Agent, or Firm* — Cooper Legal Group, LLC

(57) ABSTRACT

One or more plasma etching techniques are provided. Selective plasma etching is achieved by introducing a gas into a chamber containing a photoresist over a substrate, establishing a bias at a frequency to convert the gas to a plasma at the frequency, and using the plasma to etch the photoresist. The frequency controls an electron density of the plasma and by maintaining a low electron density causes free radicals of the plasma to chemically etch the photoresist, rather than physically etching using ion bombardment. A mechanism is thus provided for chemically etching a photoresist under what are typically physical etching conditions.

19 Claims, 4 Drawing Sheets

PLASMA GENERATION AND PULSED PLASMA ETCHING

BACKGROUND

Semiconductor device formation comprises masking, patterning and etching to form various components of a semiconductor device.

DESCRIPTION OF THE DRAWINGS

Aspects of the disclosure are understood from the following detailed description when read with the accompanying drawings. It will be appreciated that elements and/or structures of the drawings are not necessarily be drawn to scale. Accordingly, the dimensions of the various features may be arbitrarily increased and/or reduced for clarity of discussion.

DETAILED DESCRIPTION

Figure 1:
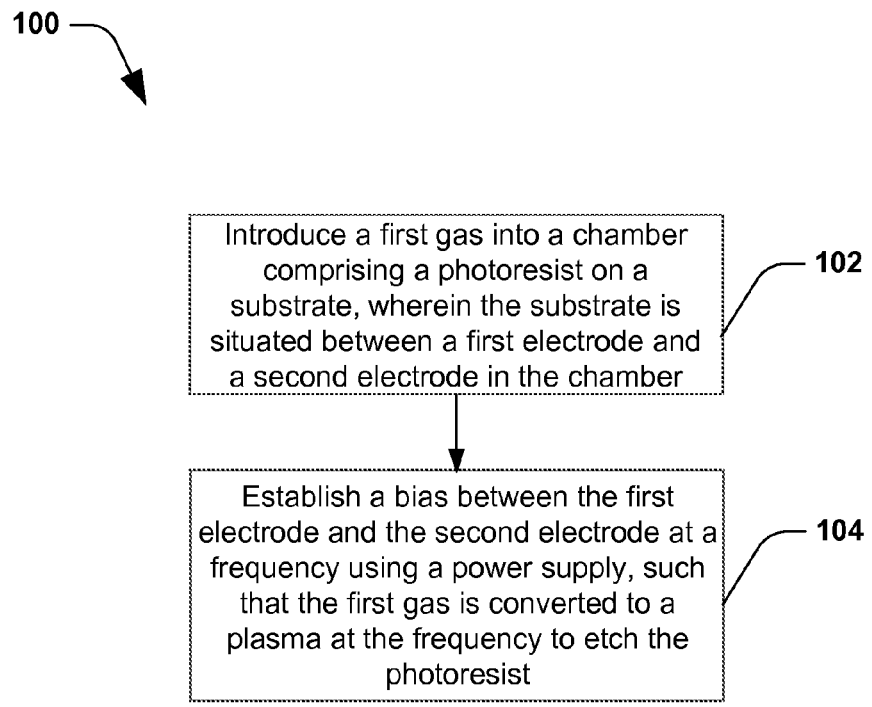
FIG. 1 illustrates of method of plasma etching, according to some embodiments.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter may be practiced without these specific details. In other instances, structures and devices are illustrated in block diagram form in order to facilitate describing the claimed subject matter.

One or more methods of plasma etching are provided. A method of plasma etching, according to some embodiments, comprises introducing a first gas into a chamber, where the chamber contains a photoresist situated between a first electrode and a second electrode, establishing a bias between the first electrode and the second electrode at a frequency to convert the first gas into plasma at the frequency to etch the photoresist. Plasma etching, as provided herein, is useful for increasing the precision of pattern transfer, improving line width roughness (LWR), lowering plasma electron temperature, and increasing the selectivity of etching. According to some embodiments, a photoresist is patterned over a substrate. In some embodiments, the substrate comprises multiple layers. In some embodiments, the photoresist is subject to one or more treatments. In some embodiments, the substrate is situated between a first electrode and a second electrode in a chamber. In some embodiments, the treating comprises introducing a first gas into the chamber, such that the photoresist is exposed to the first gas. In some embodiments, a bias is established between the first electrode and the second electrode at a frequency using a power supply. In some embodiments, the application of the bias converts the first gas to plasma. In some embodiments, the plasma etches the photoresist. In some embodiments, free radicals of the plasma etch the photoresist. In some embodiments, the frequency controls an electron density, such that ion bombardment is inhibited, and chemical etching with the free radicals is promoted. In some embodiments, the chemical etching is more selective than a physical etching that results from ion bombardment. In some embodiments, the photoresist has a first portion having a first portion width and second portion, below the first portion, having a second portion width, the first portion width less than the second portion width. In some embodiments, after etching the first portion has a first post treatment width and the second portion, below the first portion, has a second post treatment width, the first post treatment width substantially equal to the second post treatment width. In some embodiments, after etching, the sidewalls of the photoresist have a LWR between about 3.5 to about 5 because a greater amount of chemical etching is completed than physical etching. LWR comprises 3 times the standard deviation of the line width along a sidewall line, such that a greater LWR indicates a rough or bumpy sidewall, and a lesser LWR indicates a smoother or less bumpy sidewall. In some embodiments, etching the photoresist as provided herein produces a more precise, uniform, sharp, etc. pattern within the resist, at least as compared to other techniques that do not use plasma to etch a photoresist as provided herein. The patterned photoresist thus allows for improved pattern transfer to other layers. According to some embodiments, because the pattern etched into the photoresist is improved in that it is more uniform, precise, has a reduced LWR, etc., layers into which this pattern is transferred likewise experience more precision, uniformity, less blur, etc. Features, elements, etc. formed using a photoresist etched as provided herein are thus more likely to yield devices that preform in a more desired, predictable, ideal, etc. manner because the components or building blocks of such devices are less irregular or otherwise shaped or configured other than anticipated, designed, desired, etc.

Figure 2:
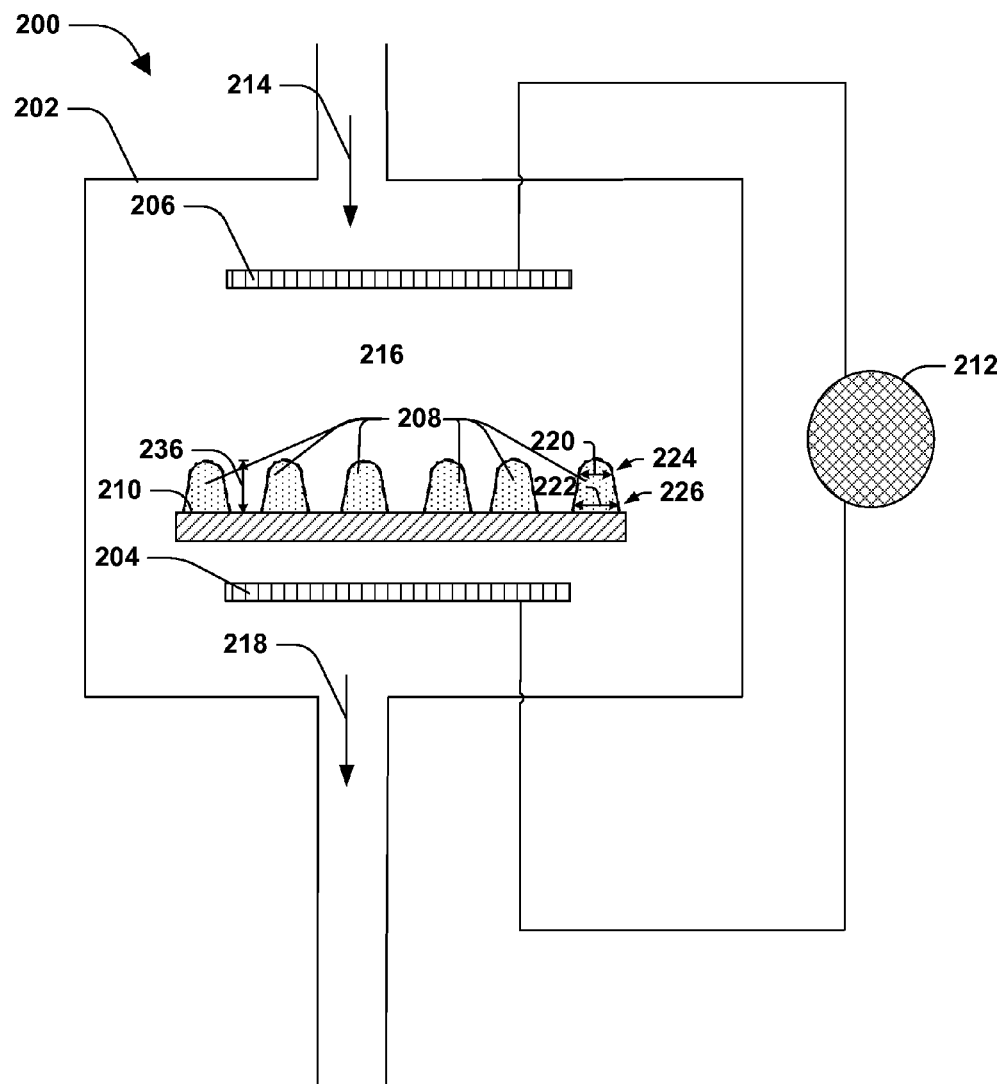
FIG. 2 illustrates plasma etching within a chamber, according to some embodiments.
Figure 3:
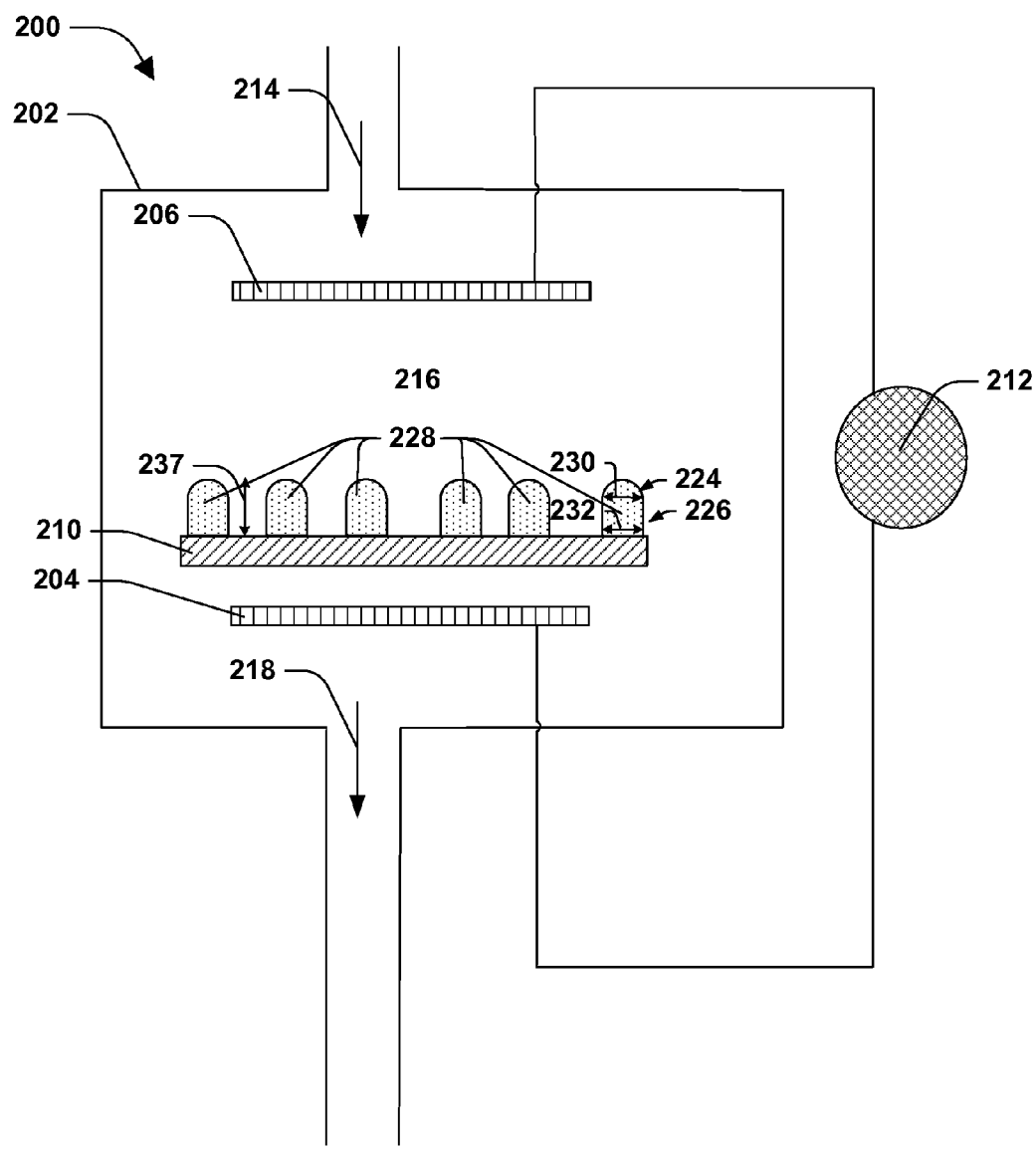
FIG. 3 illustrates plasma etching within a chamber, according to some embodiments.

A first method 100 of plasma etching is illustrated in FIG. 1, and one or more arrangements 200 for implementing such methodology are illustrated in FIG. 2-3. As illustrated in FIG. 3, as a result of the plasma etching, a treated photoresist 228 has a first portion 224 with a first post treatment width 230 and a second portion 226 having a second post treatment width 232, the first post treatment width 230 substantially equal to the second post treatment width 232. Turning to FIG. 1, at 102 a first gas 216 is introduced into a chamber 202, such as via a gas feed 214, so that a photoresist 208 is exposed to the first gas 216, as illustrated in FIG. 2. The photoresist 208 is over a substrate 210 that is situated between a first electrode 204 and a second electrode 206 within the chamber 202. In some embodiments, the photoresist 208 has undergone patterning such that multiple separate aspects of the photoresist represent a pattern that has been transferred to and formed within the photoresist. In some embodiments, the photoresist is used to transfer the pattern formed therein to one or more layers under the photoresist, where such layers are not illustrated but are situated between the photoresist 208 and the substrate 210. In some embodiments, the photoresist 208 has a first portion 224 having a first width 220 and a second portion 226 having a second width 222, the first width 220 less than the second width 222. In some embodiments, the photoresist 208 comprises at least one of C, H, or O. In some embodiments, the photoresist 208 has a height 236 of between about 80 nm to about 250 nm. In some embodiments, the substrate 210 comprises at least one of Si or $HFO_2$. In some embodiments, the substrate 210 comprises multiple layers. In some embodiments, the substrate 210, or one or more layers between the photoresist 208 and the substrate 210, comprises a dielectric layer. In some embodiments, the dielectric layer comprises at least one of SiN, Oxide, low dielectric constant material, SiON, or a nitride. In some embodiments, the substrate 210, or one or more layers between the photoresist 208 and the substrate 210, comprises a metal gate layer. In some embodiments, the metal gate layer comprises a metal, such as TiN. In some embodiments, the first gas 216 exits the chamber via a gas drain 218. In some embodiments, the first gas 216 comprises at least one of $N_2H_2$, $H_2$, Ar, $CH_4$, HBr, or $Cl_2$.

Figure 4:
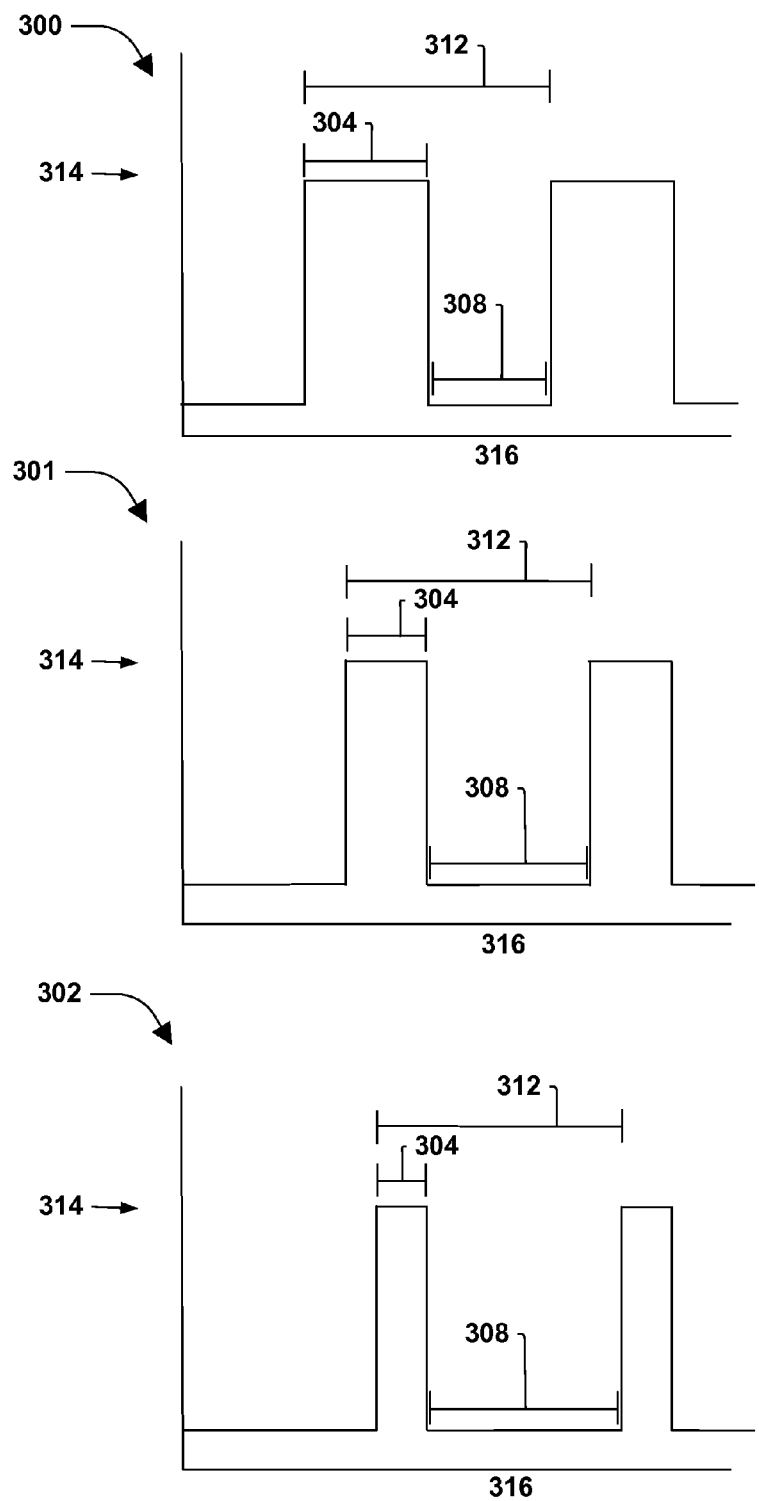
FIG. 4 illustrates variations of a duty cycle associated with plasma etching, according to some embodiments.

At 104, a bias is established between the first electrode 204 and the second electrode 206 at a frequency using the power supply 212. In some embodiments, the first electrode 204 comprises at least one of a cathode or an anode. In some embodiments, the second electrode 206 comprises at least one of a cathode or an anode. In some embodiments, electrons flowing out of the cathode are accelerated when a voltage is applied by the power supply 212 to create a bias voltage between the cathode and the anode. In some embodiments, the anode is grounded and the voltage is applied to the cathode. In some embodiments, after the first gas 216 is introduced to the chamber 202, the bias is established by application of voltage or current by the power supply 212 at a frequency. In some embodiments, the power supply 212 is between 500 w to about 2,000 w. In some embodiments, the bias comprises a range between about 0V to about 50V. In some embodiments, establishing the bias comprises applying the power supply 212 to at least one of the first electrode 204 or the second electrode 206 according to a duty cycle 312, as illustrated in FIG. 4, where the duty cycle 312 occurs at the frequency. In some embodiments, the duty cycle 312 comprises a power on state 304 and a power off state 308, the power on state 304 corresponding to the power supply 212 being applied to at least one of the first electrode 204 or the second electrode 206 and the power off state 308 corresponding to the power supply 212 being applied equally the first electrode 204 and the second electrode 206 or not being applied to either the first electrode 204 and the second electrode 206. In FIGS. 4, at 300, 301, and 302, the bias voltage 314, y axis, is measured as a function of time 316, x axis. In some embodiments, the power on state 304 is between about 20% to about 50% of the duty cycle 312 and the power off state 308 is between about 50% to about 80% percent of the duty cycle 312. At 300 a duty cycle 312 comprising a 50% power on state 304 and a 50% power off state 306 is illustrated. At 301 a duty cycle 312 comprising a 40% power on state 304 and a 60% power off state 306 is illustrated. At 302 a duty cycle 312 comprising a 20% power on state 304 and an 80% power off state 306 is illustrated. In some embodiments, the power on state 304 facilitates conversion of the first gas 316 to plasma. In some embodiments, the power off state 308 facilitates conversion of the plasma back to the first gas 316. In some embodiments, more or less plasma is generated or pulsed at the frequency based on a ratio of power on state 304 to power off state 308 of the duty cycle 312. In some embodiments, the plasma has a plasma electron temperature of between about 2,000° C. to about 2,500° C. In some embodiments, the plasma electron temperature is a function of the frequency at which the bias is established between the first electrode 204 and the second electrode 206. In some embodiments, the frequency at which the bias is established between the first electrode 204 and the second electrode 206, and thus the frequency at which the duty cycle 312 occurs, is between about 1 kHz to about 20 kHz. In some embodiments, a temperature is maintained within the chamber 202 during the treating, where the temperature is between about 20° C. to about 120° C. In some embodiments, a pressure is maintained within the chamber 202 during the treating, where the pressure is between about 3 mTorr to about 200 mTorr. In some embodiments, the treating occurs for a duration, where the duration is between about 10 seconds to about 60 seconds. In some embodiments, the chamber 202 comprises plasma for a total of between about 5 seconds to about 45 seconds. In some embodiments, the treating occurs for a duration of about 30 seconds and the duty cycle 312 comprises a 50% power on state 304 and a 50% power off state 308, such that plasma is pulsed within the chamber at the frequency but exists within the chamber 202 for about 15 seconds. In some embodiments, the plasma etches the photoresist. In some embodiments, free radicals of the plasma etch the photoresist 208. In some embodiments, the frequency at which the plasma is generated or pulsed according to the duty cycle 312 controls an electron density of the plasma, such that ion bombardment is inhibited and chemical etching with the free radicals is promoted. In some embodiments, the chemical etching is more selective than a physical etching that results from ion bombardment.

Turning to FIG. 3, post application of the first method 100 is illustrated, such that the treated photoresist 228 is within the chamber 202. The treated photoresist 228 has the first portion 224 comprising the first post treatment width 230 and the second portion 226 comprising the second post treatment width 232, where the first post treatment width 230 is substantially the same as the second post treatment width 232. In some embodiments, the treated photoresist 228 has line width roughness (LWR) of between about 3.5 to about 5. In some embodiments, the photoresist 208, prior to treatment, has a LWR of greater than 5. In some embodiments, the treated photoresist 228, or at least some aspects thereof, has a post treatment height 237 that is less than the height 236 of the photoresist 208 prior to treatment. According to some embodiments, the treated photoresist 228 has at least one of a total surface area or volume that is less than at least one of a total surface area or volume of the photoresist 208 prior to treatment.

According to some embodiments, a method for plasma etching comprises treating a photoresist that is over a substrate. In some embodiments, the substrate is situated between a first electrode and a second electrode in a chamber. In some embodiments, the treating comprises introducing a first gas into the chamber such that the photoresist is exposed to the first gas and establishing a bias between the first electrode and the second electrode at a frequency using a power supply such that the first gas is converted to plasma at the frequency to etch the photoresist.

According to some embodiments, a method for plasma etching comprises treating a photoresist that is over a substrate. In some embodiments, the substrate is situated between a first electrode and a second electrode in a chamber. In some embodiments, the treating comprises introducing a first gas into the chamber such that the photoresist is exposed to the first gas and establishing a bias between the first electrode and the second electrode at a frequency using a power supply. In some embodiments, the bias is established such that the first gas is converted to plasma at the frequency to control an electron density of the plasma and such that the photoresist is etched with a free radical of the plasma.

According to some embodiments, a method for plasma etching comprises treating a photoresist that is over a substrate. In some embodiments, the substrate is situated between a first electrode and a second electrode in a chamber. In some embodiments, the treating comprises introducing a first gas into the chamber such that the photoresist is exposed to the first gas. In some embodiments, a bias is established between about 0V to about 50V between the first electrode and the second electrode at a frequency of between about 1 kHz to about 20 kHz such that the first gas is converted to plasma at the frequency to etch the photoresist.

Although the subject matter has been described in language specific to structural features or methodological acts, it is to be understood that the subject matter of the appended claims is not necessarily limited to the specific features or acts described above. Rather, the specific features and acts described above are disclosed as embodiment forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method for plasma etching, comprising:
    patterning a photoresist to form a patterned photoresist, wherein the patterning creates an opening through the photoresist and a first sidewall of a first portion of the patterned photoresist and a second sidewall of a second portion of the patterned photoresist below the first portion of the patterned photoresist that together define one side of the opening are tapered; and
    treating the first sidewall and the second sidewall while the patterned photoresist is situated between a first electrode and a second electrode in a chamber and while maintaining a temperature within the chamber between about 20° C. to about 120° C., the treating comprising:
        introducing a first gas into the chamber to expose the first sidewall and the second sidewall to the first gas while the chamber is free of plasma; and
        after exposing the first sidewall and the second sidewall to the first gas, establishing a bias between the first electrode and the second electrode to convert the first gas to plasma, the bias established according to a frequency and a duty cycle selected based on a specified electron density of the plasma, wherein:
            free radicals of the plasma chemically etch the second sidewall of the patterned photoresist to change a slope of the second sidewall such that the second sidewall is non-tapered after the treating; and
            the temperature within the chamber pre-heats the patterned photoresist prior to the establishing a bias to convert the first gas to plasma.

2. The method of claim 1, the bias between about 0 V to about 50 V.

3. The method of claim 1, the frequency between about 1 kHz to about 20 kHz.

4. The method of claim 1, the establishing a bias comprising applying between about 500 W to about 2,000 W of power to at least one of the first electrode or the second electrode.

5. The method of claim 1, the duty cycle comprising a power on state during which power is applied to at least one of the first electrode or the second electrode and a power off state during which power is not applied to the at least one of the first electrode or the second electrode.

6. The method of claim 5, the power on state between about 20% to about 50% of the duty cycle and the power off state between about 50% to about 80% of the duty cycle.

7. The method of claim 1, further comprising maintaining a pressure within the chamber during the treating.

8. The method of claim 7, the pressure between about 3 mTorr to about 200 mTorr.

9. The method of claim 1, the first gas comprising at least one of $N_2H_2$, $H_2$, Ar, $CH_4$, HBr, or $Cl_2$.

10. The method of claim 1, wherein the frequency is selected to facilitate conversion of at least some of the plasma back to the first gas.

11. The method of claim 1, wherein the first electrode and the second electrode remain powered on during both a portion of the duty cycle during which the bias is established and a portion of the duty cycle during which the bias is not established.

12. A method for plasma etching, comprising:
    patterning a photoresist to form a patterned photoresist, wherein:
        the patterning creates a first opening and a second opening through the photoresist;
        a first sidewall of the patterned photoresist defines the first opening and a second sidewall of the patterned photoresist defines the second opening;
        in a first portion of the patterned photoresist, the first sidewall is separated from the second sidewall by a first distance;
        in a second portion of the patterned photoresist below the first portion, the first sidewall is separated from the second sidewall by a second distance; and
        a difference between the first distance and the second distance is a first absolute value; and
    treating the patterned photoresist while the patterned photoresist is situated between a first electrode and a second electrode in a chamber and while maintaining a temperature within the chamber between about 20° C. to about 120° C., the treating comprising:
        introducing a first gas into the chamber to expose the patterned photoresist to the first gas while the first electrode and the second electrode are powered off; and
        after exposing the patterned photoresist to the first gas, establishing a bias between the first electrode and the second electrode to convert the first gas to plasma for etching the patterned photoresist, wherein:
            the temperature within the chamber pre-heats the patterned photoresist prior to the establishing a bias to convert the first gas to plasma;
            free radicals of the plasma chemically etch the patterned photoresist; and
            the first distance and the second distance are substantially the same after the establishing a bias.

13. The method of claim 12, the plasma having a plasma electron temperature of between about 2,000° C. to about 2,500° C.

14. The method of claim 12, the establishing a bias comprising establishing the bias according to a frequency associated with a power supply from which power is applied to at least one of the first electrode or the second electrode to establish the bias, the frequency between about 1 kHz to about 20 kHz.

15. The method of claim 12, the bias established according to a frequency and a duty cycle selected based on a specified electron density of the plasma.

16. A method for plasma etching, comprising:
    patterning a photoresist to form a patterned photoresist, wherein the patterned photoresist has a line width roughness (LWR); and
    treating the patterned photoresist while the patterned photoresist is situated between a first electrode and a second electrode in a chamber and while maintaining a temperature within the chamber between about 20° C. to about 120° C., the treating comprising:
        introducing a first gas into the chamber to expose the patterned photoresist to the first gas while no bias exists between the first electrode and the second electrode; and
        establishing a bias of between about 0V to about 50V between the first electrode and the second electrode at a frequency of between about 1 kHz to about 20 kHz to convert the first gas to plasma for etching the patterned photoresist, wherein:
            the temperature within the chamber pre-heats the patterned photoresist prior to the establishing a bias to convert the first gas to plasma;
            the frequency is selected based on a specified electron density of the plasma;
            free radicals of the plasma chemically etch the patterned photoresist such that after the etching a second sidewall of a second portion of the patterned photoresist below a first portion of the patterned photoresist is non-tapered; and
            the LWR of the patterned photoresist decreases due to chemically etching the patterned photoresist using the free radicals.

17. The method of claim 16, the establishing a bias comprising applying power to at least one of the first electrode or the second electrode according to a duty cycle selected based on the specified electron density of the plasma.

18. The method of claim 17, the duty cycle comprising a power on state during which power is applied to at least one of the first electrode or the second electrode and a power off state during which power is not applied to the at least one of the first electrode or the second electrode.

19. The method of claim 16, the establishing a bias comprising:
    establishing the bias after exposing the patterned photoresist to the first gas.

* * * * *